United States Patent [19]

Tsuchiya

[11] Patent Number: 5,003,268
[45] Date of Patent: Mar. 26, 1991

[54] OPTICAL SIGNAL SAMPLING APPARATUS

[75] Inventor: Yutaka Tsuchiya, Shizuoka, Japan

[73] Assignee: Hamamatsu Photonics Kabushiki Kaisha, Shizuoka, Japan

[21] Appl. No.: 342,931

[22] Filed: Apr. 25, 1989

[30] Foreign Application Priority Data

May 13, 1988 [JP] Japan .................. 63-116733

[51] Int. Cl.$^5$ .................. H01S 3/10; H04B 9/00
[52] U.S. Cl. .................. 330/4.3; 372/25
[58] Field of Search .................. 330/4.3; 356/226; 455/608, 610, 611; 350/96.13, 96.14; 372/25

[56] References Cited

U.S. PATENT DOCUMENTS

| | | | |
|---|---|---|---|
| 3,887,876 | 6/1975 | Zeidler | 330/4.3 |
| 4,364,014 | 12/1982 | Gray | 372/25 |
| 4,484,144 | 11/1984 | Nakagome et al. | 455/610 |
| 4,554,510 | 11/1985 | Shaw et al. | 330/4.3 |
| 4,736,164 | 4/1988 | Henning | 330/4.3 |

Primary Examiner—Nelson Moskowitz
Attorney, Agent, or Firm—Finnegan, Henderson, Farabow, Garrett, and Dunner

[57] ABSTRACT

An optical signal sampling apparatus for high-speed gating of an optical signal in the form of repetitive waveforms comprises an input optical path for introducing the optical signal to an optical amplifier; the optical amplifier whose gain is adjustable by a gating electrical signal, for amplifying the optical signal; a driving circuit for providing, in response to a sampling signal, the optical amplifier with the gating electrical signal having a series of pulses which are gradually shifted on a time axis with respect to the repetitive waveforms of the optical signal; and an output optical path for introducing an output optical signal from the optical amplifier.

9 Claims, 9 Drawing Sheets

OPTICAL SIGNAL SAMPLING APPARATUS

BACKGROUND OF THE INVENTION

The present invention relates to an optical signal sampling apparatus suitable for high-speed gating of optical signals to be measured. More particularly, the present invention relates to a novel optical signal sampling apparatus that is suitable for application to a high-speed light waveform measuring system and which is capable of efficient gating (sampling) of optical signals, with the added advantage that the timing of sampling can be controlled electrically in an easy way.

Devices conventionally used to sample optical signals include a mechanical chopper using a rotating plate with a slit, an optical Kerr shutter having a Kerr cell which is filled with $CS_2$ or other organic solvent and held between a pair of orthogonally crossed polarizing elements, and a liquid-crystal shutter.

These conventional apparatus, however, have their own problems. A mechanical chopper is limited in its operating speed and involves difficulty in control. An optical Kerr shutter has the need to apply a high ($\simeq 1$ kV) voltage to produce double refraction in the cell medium and this presents difficulty in handling, besides the need to employ a complicated power source. Furthermore, because of the use of polarized light waves, a pair of orthogonally crossed polarizing elements must be employed, resulting in great loss of light intensity. A liquidcrystal shutter also needs a pair of orthogonally crossed polarizing elements and causes substantial light intensity loss. In addition, the ratio of transmittance in transmitting state to that in blocking state is much less than 1,000, which is too small to achieve satisfactory sampling. Another problem with the liquid-crystal shutter has been the difficulty encountered in attempts to improve the sampling rate and gating time.

SUMMARY OF THE INVENTION

An object, therefore, of the present invention is to provide a novel optical signal sampling apparatus with which an optical signal can be easily sampled at high speed and with high precision.

This object of the present invention can be attained by an apparatus for high-speed gating of optical signals of interst which includes: an optical amplifier that amplifies an optical signal and whose gain is adjustable by an electrical signal; an input optical path through which an optical signal of interest is supplied to said optical amplifier; a drive circuit that supplies said optical amplifier with an electrical pulse signal as a gating pulse after converting a sampling signal into the electrical pulse signal; and an output optical path that passes the optical signal which has been sampled in said optical amplifier by changing its gain in the form of a series of pulses.

In one specific embodiment, said optical amplifier is designed as a non-resonant traveling-wave type optical amplifier in which an anti-reflection film is coated on both end faces of a semiconductor laser to suppress reflection from those end faces.

In another specific embodiment, said optical amplifier is designed as a non-resonant traveling-wave type optical amplifier in which reflection from both end faces of a semiconductor laser is suppressed by preadjusting each of their angles to be equal to the Brewster angle.

In still another specific embodiment, said input optical path is formed of an optical fiber, the length of which is pre-adjusted in accordance with the desired timing of arrival of optical and electrical signals at said optical amplifier.

In a further embodiment, said optical amplifier, input optical path, drive circuit and output optical path are enclosed with a light-shielding electroconductive casing.

In a still further embodiment, said sampling signal is formed by performing photoelectric conversion on a partly branched optical signal of interest.

In another embodiment, the optical signal sampling apparatus of the present invention further includes a photodetector for detecting an output optical signal from said optical amplifier and a lock-in amplifier that performs lock-in amplification of an output signal from the photodetector in accordance with a lock-in signal which is in synchronism with said sampling signal, wherein said electrical pulse signal applied to said optical amplifier is modulated by the lock-in signal.

In still another embodiment, an independent pulse generator is provided for generating said lock-in signal which is not synchronized with said sampling signal.

In a further embodiment, a plurality of units of said apparatus are arranged in parallel and an image sensor for detecting the output optical signal from each unit is provided to enable a plurality of optical signals of interest to be measured simultaneously and in a parallel mode.

Other and further objects, features and advantages of the invention will appear more fully from the following description taken in connection with the accompanying drawings.

DETAILED DESCRIPTION OF THE PREFERRED EMBODIMENTS

Figure 1:
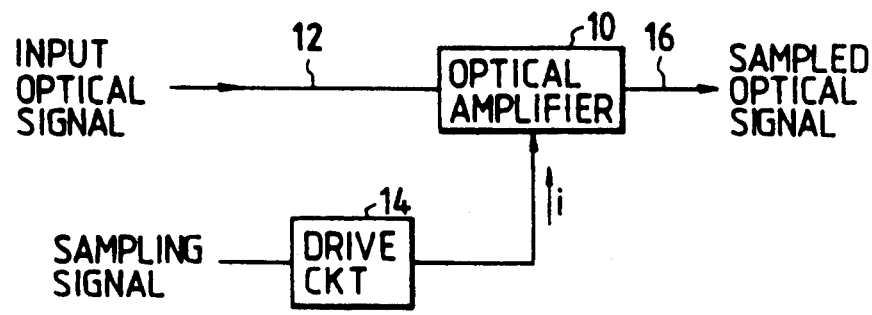
FIG. 1 is a block diagram showing the basic composition of an apparatus according to the present invention.

In high-speed gating of an optical signal of interest in accordance with the present invention, the optical signal is supplied through an input optical path 12 into an optical amplifier 10 that amplifies an optical signal and whose gain is adjustable by an electrical signal. At the same time, a sampling signal is converted into an electrical pulse signal i in a drive circuit 14, and then it is supplied as a gain control signal to the optical amplifier 10. As a result, an optical signal that has been sampled by changing the gain of the optical amplifier 10 in a form of pulses is produced. The sampled optical signal is obtained through an output optical path 16. This permits the optical signal of interest to be sampled easily at high speed and with high precision. In addition, the optical signal can be gated (sampled) efficiently, with the timing of sampling being electrically controlled in an easy way. Furthermore, the system composition is so simple that the use of a compact and inexpensive apparatus can be realized. The use of an optical amplifier offers the added advantage that even faint light can be detected by amplifying the optical signal of interest.

The optical amplifier 10 that is capable of producing an optical output by amplifying input light by a factor that is dependent on an external electrical signal is available in various types including: a non-resonant traveling-wave type optical amplifier (TWA) which has an anti-reflection film coated on both end faces of a semiconductor laser to suppress reflection from those faces; a Fabry-Perot type optical amplifier (FPA) which uses a conventional semiconductor laser as an optical amplifier with it being biased below the threshold level for oscillation; an optical fiber Raman amplifier which utilizes Raman scattering induced in an optical fiber; an amplifier using a DFB laser; and an injection synchronous amplifier. Semiconductor amplifiers are advantageous because of their compactness and ease of control in operation.

Among semiconductor optical amplifiers, TWA and FPA are particularly advantageous. TWA has fast response to electrical signals and is capable of amplification of high speed optical signals. Because of the absence of resonator-dependent selectivity for wavelength, TWA has a broad (ca. 50 nm) wavelength range for gain and assures consistency in gain in the face of variations in the temperature of the amplifier or in the wavelength of incident light. TWA is also superior in terms of gain saturation and noise characteristic which are two important characteristics of an optical amplifier. On the other hand, FPA is easy to fabricate and allows a high gain to be attained in the neighborhood of a threshold value even with low current injection because it utilizes multiple reflections between both end faces to produce signal gain.

Another advantage of the semiconductor optical amplifiers is that their gain can be easily adjusted by changing the amount of injection current, so they can also be used as an optical switch by turning on or off the injection of current as in the present invention.

Figure 2:
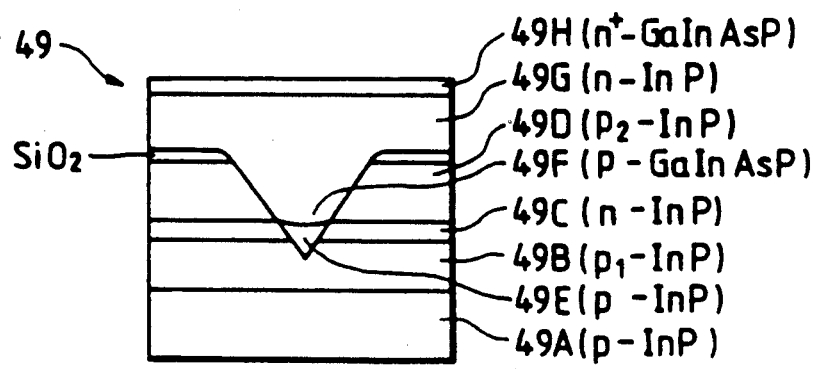
FIG. 2 is a cross section showing an illustrative composition of a semiconductor laser which is the main component of a traveling-wave type optical amplifier (TWA) used as an example of the optical amplifier in the apparatus of the present invention.

A TWA that is suitable for use in the present invention has an anti-reflection film coated on both end faces of a semiconductor laser 49 of the VIPS (V-grooved inner stripe on p-substrate) structure shown in FIG. 2, which may be formed by the following steps: in the first cycle of liquid-phase growth, a $p_1$-InP buffer layer 49B, n-InP block layer 49C and $p_2$-InP block layer 49D are grown on a p-InP substrate 49A; thereafter a V-shaped groove having a (111)B face is formed in 49B, 49C and 49D by wet etching, with a $SiO_2$ stripe mask being prepared by a conventional photolithographic process; and in the second cycle of liquid-phase growth, a p-InP cladding layer 49E, a p-type or undoped GaInAsP active layer 49F, n-InP cladding layer 49G and $n^+$-GaInAsP contact layer 49H are grown successively. The GaInAsP active layer 49F is formed at the bottom of the V-shaped groove, with its width and thickness being controlled to ca. 1.2 $\mu$m and 0.10 $\mu$m, respectively. Thereafter, electrodes are formed and end faces are created by cleavage. An anti-reflection film is then deposited onto both end faces of the resulting semiconductor laser 49 using a material such as $SiO_2$ so as to fabricate a TWA. The semiconductor laser 49 of the VIPS structure has a sufficiently high efficiency of injection into the active layer to produce superior high output characteristics, so the TWA using this semiconductor laser also produces high gain and highly saturated output.

Figure 3:
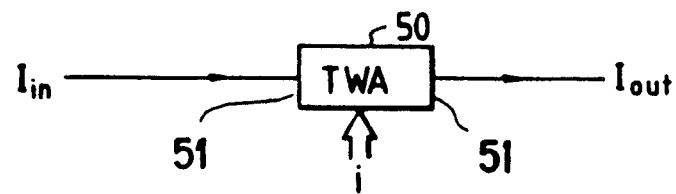
FIG. 3 is a block diagram illustrating the operating characteristics of the TWA.
Figure 4:
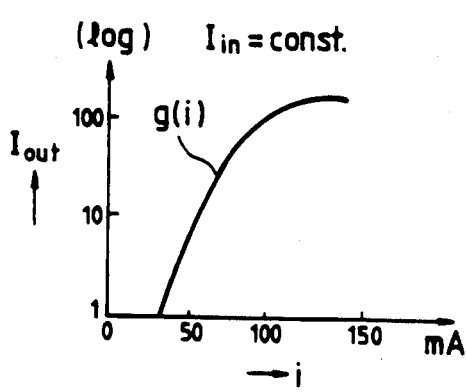
FIGS. 4 and 5 are diagrams illustrating the intensity characteristics of output light from the TWA.
Figure 5:
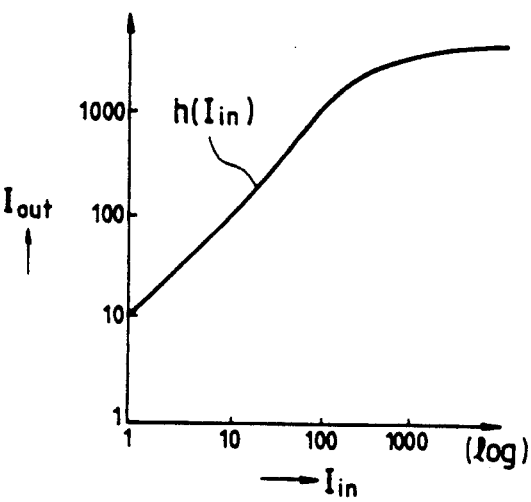

The TWA 50 thus fabricated has a basic composition as shown in FIG. 3. When the intensity of input light $I_{in}$ being launched into the TWA 50 is constant, the intensity of output light $I_{out}$ from the TWA 50 will change nonlinearly as shown in FIG. 4 in response to the change in input current i. If the value of input current i to the TWA 50 is constant, $I_{out}$ will change also nonlinearly as shown in FIG. 5 in response to the change in $I_{in}$. It can therefore be seen that when $I_{in}$ is constant, $I_{out}$ can be controlled by i, whereas $I_{out}$ can be controlled by $I_{in}$ when current i is constant.

Figure 6:
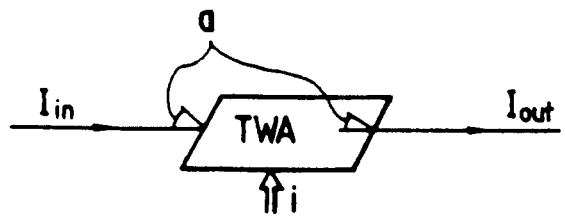
FIG. 6 is a schematic drawing of a modified version of the TWA.

In the TWA 50, reflection from both end faces is suppressed by the anti-reflection film 51 coated thereon. It should, however, be noted that the anti-reflection film 51 is not the sole mechanism for suppressing reflection from both end faces of the semiconductor laser and the same results can be attained by cutting each of the end faces at an angle a equal to the Brewster angle as shown in FIG. 6. In this case, the plane of polarization is restricted but this fact may be an advantage rather than a disadvantage when a need arises for restricting the plane of polarization because this need can be met without employing any polarizer or analyzer.

Figure 7:
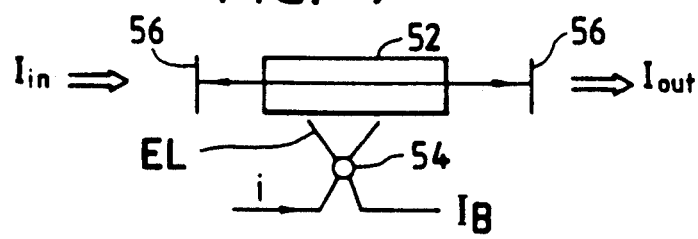
FIGS. 7–10 are schematic drawings showing other modifications of the optical amplifier used in the apparatus of the present invention.
Figure 8:
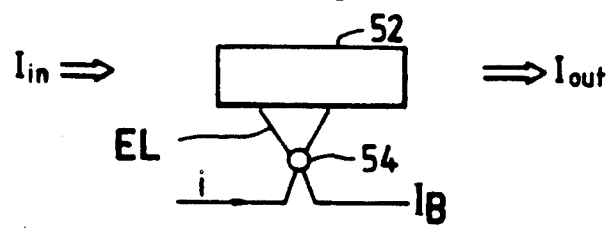

Besides the TWA 50 and FPA described above, other types of optical amplifiers can be used in the present invention, including the resonant optical amplifier shown in FIG. 7 which is biased to a level below the threshold for oscillation by imparting excitation light EL to a solid laser medium 52 with a laser diode 54, and the non-resonant optical amplifier shown in FIG. 8 that is similar to TWA in which reflection from both end faces of the solid laser medium 52 is suppressed by providing an anti-reflection film or adjusting the angle of each end face to be equal to the Brewster angle. In FIG. 7, the numeral 56 designates a resonant mirror. The laser diode 54 may or may not be supplied with a bias current $I_B$ for attaining a value in the neighborhood of the threshold level.

Figure 9:
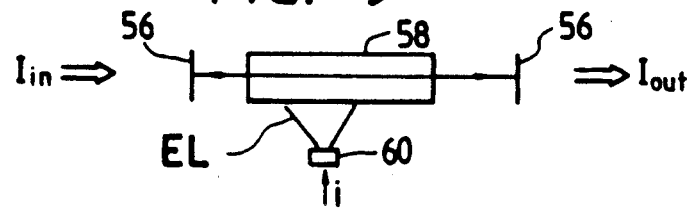

Another type of optical amplifier 10 that can be used in the present invention is shown in FIG. 9, in which a dye or gas laser medium 58 is excited with light from a light-emitting diode or a current control led lamp 60. Resonant mirrors 56 may be omitted from the system shown in FIG. 9.

Figure 10:
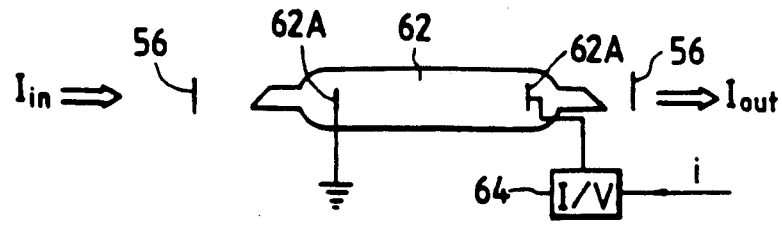

Still another type of optical amplifier that can be used in the present invention is shown in FIG. 10, in which a gas laser medium 62 is excited by discharge, or the voltage applied between electrodes 62A from a current to voltage converter 64. Resonant mirrors 56 may be omitted from the system shown in FIG. 10.

The input optical path 12 shown in FIG. 1 may be designed as an optical fiber and this has the advantage of not only obviating the need for close positional adjustment in the optical system but also enhancing the degree of freedom in the layout of constitutional elements, which leads, for example, to a reduction in the size of the overall system. The length of the optical fiber may be adjusted in such a way that the timing of arrival of an optical signal at the optical amplifier 10 will coincide with that of an electrical signal. If the length of the optical fiber is adjusted in such a way that an electrical signal will arrive at the optical amplifier 10 earlier than an optical signal, sampling can be effected before the optical signal of interest rises.

The output optical path 16 shown in FIG. 1 may also be designed as an optical fiber and this has the advantage of not only obviating the need for close positional adjustment in the optical system but also enhancing the degree of freedom in the layout of constitutional elements, which leads, for example, to a reduction in the size of the overall system.

The optical amplifier 10, input optical path 12, drive circuit 14 and output optical path 16 may be enclosed with a light-shielding electroconductive casing, such as a metallic casing. This has the advantage of preventing not only electromagnetic induction but also the incidence of light disturbances.

Figure 11:
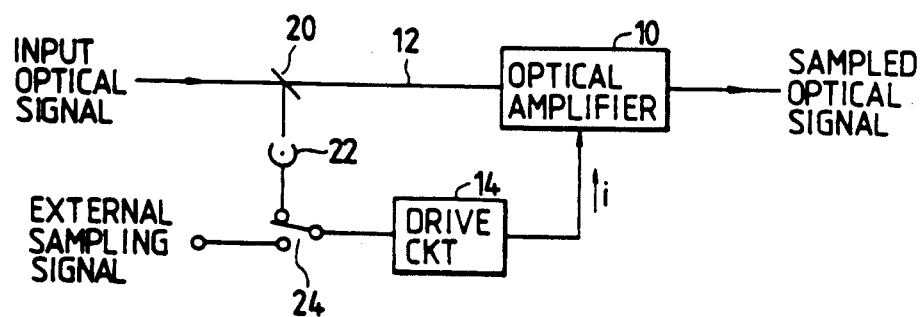
FIGS. 11 and 12 are block diagrams showing other basic compositions of apparatus according to the present invention.

If desired, part of the optical signal of interest may be branched by a beam splitting means 20 and subjected to photoelectric conversion in a photodetector 22 as shown in FIG. 11. This offers the advantage of enabling automatic synchronization sampling by the optical signal itself to be measured.

The system shown in FIG. 11 includes a mode selecting switch 24 that enables selection between automatic synchronization sampling by the optical signal itself and sampling by an external electrical signal. This increases the flexibility of the system to various changes in the optical signal of interest and at the same time, it enables the sampling in synchronism with a standard electrical clock signal, etc.

Figure 12:
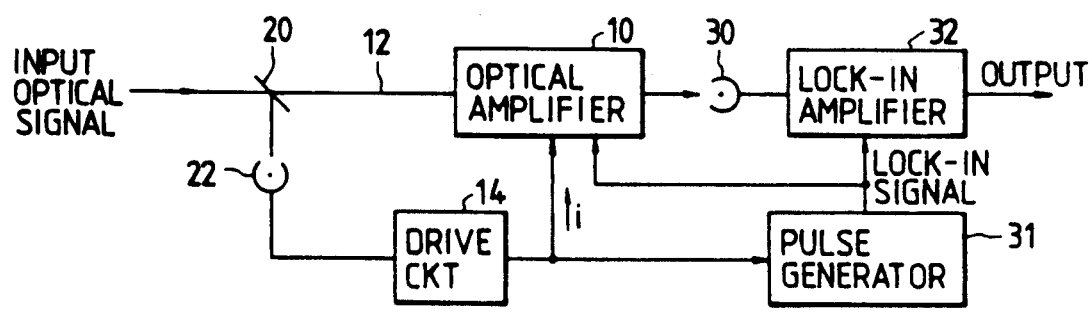

FIG. 12 shows another embodiment of the present invention which includes a photodetector 30 for sensing an output optical signal from the optical amplifier 10 and a lock-in amplifier 32 for amplifying the output of this photodetector 30 in synchronism with a lock-in signal from a pulse generator 31, where the lock-in signal is synchronized with the sampling signal. In this embodiment, the lock-in signal which is an output from the pulse generator 31 is used to perform on-off control over the optical amplifier 10, or the output signal from the pulse generator 31 is used to modulate the electrical pulse signal i which changes the gain of the optical amplifier. Besides the advantages already described, the embodiment shown in FIG. 12 provides an improvement in S/N ratio due to the utilization of lock-in amplification.

If the pulse generator 31 which generates a lock-in signal to control the drive pulse of the optical amplifier 10 and/or lock-in amplifier 32 is provided independently, external locking-in can be accomplished independently of the sampling signal and the optical signal to be measured.

In a further embodiment, a plurality of units of the high-speed optical signal sampling apparatus described above are arranged side by side and an image sensor for detecting the output optical signals from those units is provided. This arrangement enables a plurality of optical signals of interest to be measured simultaneously and in a parallel way.

Specific embodiments of the present invention are described below in greater detail with reference to the accompanying drawings.

Figure 13:
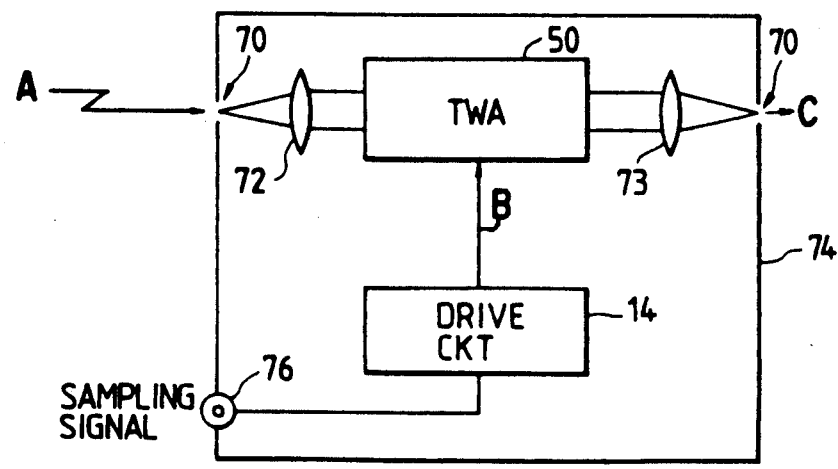
FIG. 13 is a block diagram showing the composition of an optical signal sampling apparatus according to a first embodiment of the present invention.

A first embodiment of the present invention is generally an optical signal sampling apparatus which comprises an optical amplifier 10, an input optical path 12, a drive circuit 14 and an output optical path 16 as shown in FIG. 1. This embodiment is shown more specifically in FIG. 13; the optical amplifier 10 is designed as TWA 50, the input optical path 12 is composed of an aperture 70 and a lens 72, the output optical path 16 is composed of a lens 73 and an aperture 70, and the TWA 50, lenses 72 and 73, and drive circuit 14 are enclosed with a metallic casing 74, with the apertures 70 being formed in the metallic casing 74. The system shown in FIG. 13 also includes a connector 76 for introducing an external sampling signal into the system.

Figure 14:
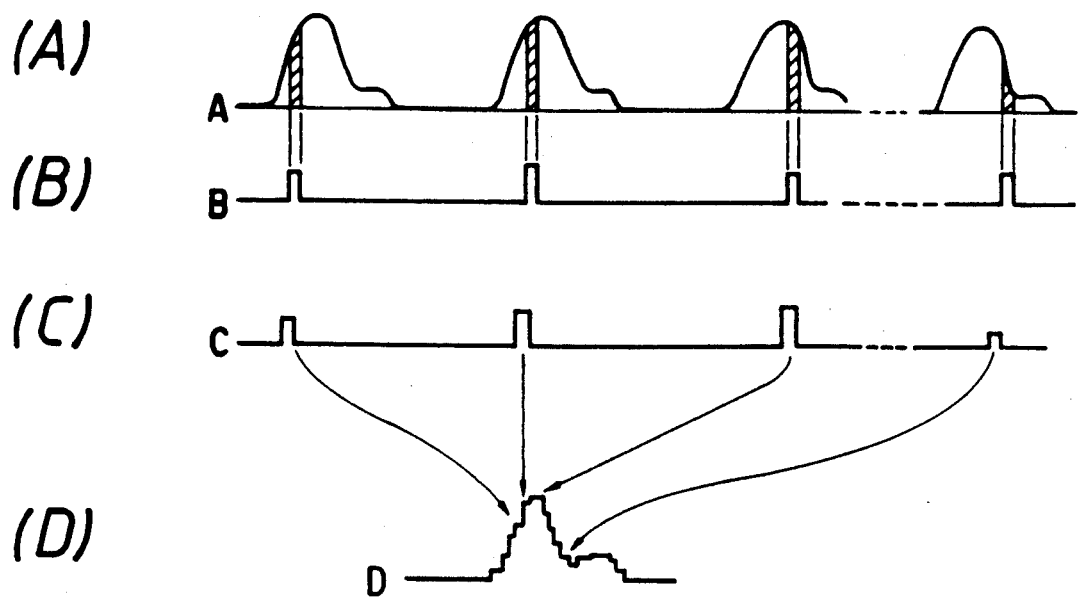
FIG. 14 is a diagram showing the operating waveforms for various parts of the apparatus according to the first embodiment.

The operation of the first embodiment is described below. Suppose here that an inlet optical signal A of interest having repetitive waveforms as shown in FIG. 14(A) is to be sampled in such a manner that the sampling portion of the signal is gradually shifted. The drive circuit 14 will produce, as shown in FIG. 14(B), a drive signal B consisting of a series of pulses which are gradually shifted on a time axis with respect to the repetitive waveforms of the optical signal. Therefore, the TWA 50 acts in such a way that it amplifies the input optical signal A of interest with high gain within the duration of time for which a pulse drive signal is on, whereas it blocks the optical signal of interest when the drive signal is at "zero" level. Accordingly, sampled optical signal C outputs that have been sampled successively by means of the drive signal as shown in FIG. 14(C) will be produced from the aperture 70 in the output optical path 16. By reconstructing these sampled optical outputs, a reconstructed waveform D can be obtained as shown in FIG. 14(D).

In the first embodiment described above, TWA 50, drive circuit 14 and lenses 72 and 73 are enclosed with the metallic casing 74, with apertures 70 being formed in the casing 74, so not only can electromagnetic induction be prevented but also light disturbances can be blocked, and this permits measurements to be performed with high precision while eliminating the effects of any disturbance in the system.

The lens 73 on the output side may be omitted if the relationship with a photodetector to be connected at a subsequent stage for sensing the light of interest so requests.

Figure 15:
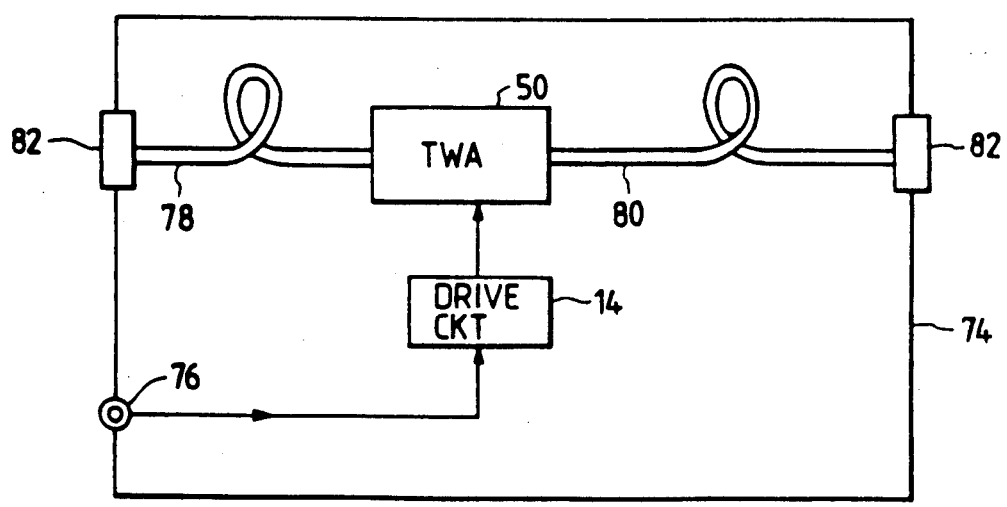
FIG. 15 is a a block diagram showing the composition of an optical signal sampling apparatus according to a second embodiment of the present invention.

A second embodiment of the present invention is described below in greater detail with reference to FIG. 15. This embodiment is also an optical signal sampling apparatus which consists basically of an optical amplifier 10, an input optical path 12, a drive circuit 14 and an output optical path 16 as shown in FIG. 1. As shown more specifically in FIG. 15, the optical amplifier 10 is designed as TWA 50, the input optical path 12 and the output optical path 16 are designed as optical fibers 78 and 80, respectively, and the TWA 50, optical fibers 78 and 80 and drive circuit 14 are enclosed with a metallic casing 74. The system shown in FIG. 15 also includes optical fiber connectors 82.

In the second embodiment of the present invention, each of the input and output optical paths 12 and 16 is formed of an optical fiber, so not only is the need for close positional adjustment in the optical system obviated but also the degree of freedom in the layout of constitutional elements is enhanced, which leads, for example, to a reduction in the size of the overall system.

A particular advantage of this embodiment which stems from the use of the optical fiber 78 as the input optical path 12 is that the length of this optical fiber can be pre-adjusted in such a way that the timing of arrival of the optical signal at the TWA 50 will coincide with that of the electrical drive signal. By so doing, the timing of the optical signal can be synchronized with that of the drive signal in spite of the transmission delay of the electrical signal as compared to the optical signal or of the delay of the electrical signal in the drive circuit 14. If desired, the length of the optical fiber 78 may be pre-adjusted in such a way that the electrical signal will arrive at the TWA 50 earlier than the optical signal (normally, an optical signal propagates faster than an electrical signal) and this enables the sampling of the optical signal before its rise.

The optical fiber 80 on the output side and the optical connector 82 coupled thereto may be omitted if the relationship with a photodetector to be connected at a subsequent stage for sensing the light of interest so requests.

Figure 16:
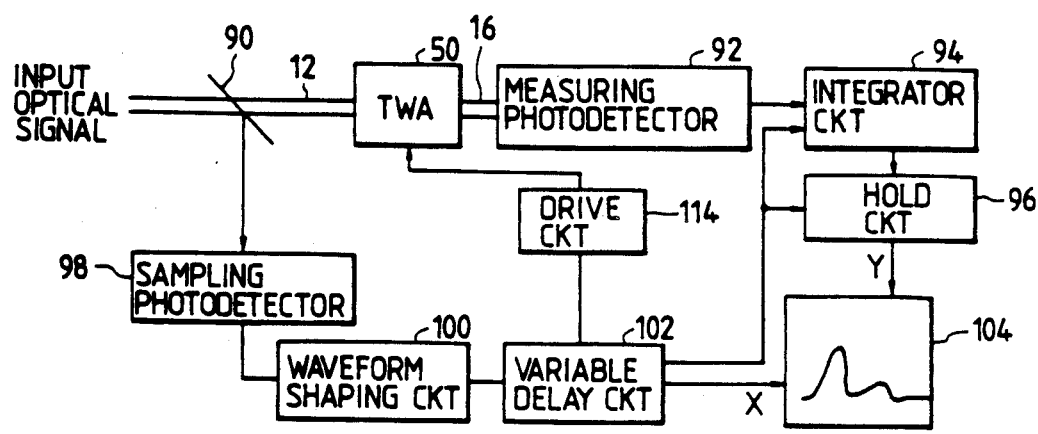
FIG. 16 is a block diagram showing the composition of an optical signal sampling apparatus according to a third embodiment of the present invention as it is applied to a sampling type light waveform measuring system.

A third embodiment of the present invention in which the present invention is applied to a sampling type light waveform measuring apparatus is described in greater detail with reference to FIG. 16. The system of this third embodiment comprises: a beam splitter 90 for branching the optical signal of interest into two signals; TWA 50 of the present invention which is supplied through the input optical path 12 with one of the two optical signals produced by branching with the beam splitter 90; a measuring photodetector 92 which is supplied through the output optical path 16 with an output optical signal from TWA 50; an integrator circuit 94 for integrating the output of the photdetector 92; a hold circuit 96 for storing the results of integration by the integrator circuit 94; a sampling photodetector 98 for detecting the other optical signal from the beam splitter 90; a waveform shaping circuit 100 by which the waveform of the optical signal sampled with the sampling photodetector 98 is shaped when necessary to produce a sampling signal; a variable delay circuit 102 for generating successive shaped sampling signals whose delay times are gradually changed; a drive circuit 114 of the present invention for supplying the TWA 50 with a drive signal that is generated in response to the output of the variable delay circuit 102; and a display unit 104 which is supplied on the X-axis with a signal proportional to the delay time of the variable delay circuit 102 and on the Y-axis with the output from the hold circuit 96 that has been updated for new values in synchronism with sampling pulses.

If desired, the delay time fixed by the variable delay circuit 102 may be changed in a step where a certain number of the sampling pulses are included, and the timing signal indicating the change of this step may be used to control the integrator circuit 94 and the hold circuit 96.

The measuring photodetector 92 may be selected from among various devices having a wide dynamic range such as a photomultiplier tube, a photodiode and an avalanche photodiode. It is not always necessary that the response speed of this photodetector is fast.

The sampling photodetector 98 may be in the form of a high-speed photodetector such as a photoelectric tube, a photomultiplier tube, a photodiode and a PIN photodiode.

The display unit 104 may be an X/Y recorder, oscilloscope, CRT or the like.

The waveform shaping circuit 100 may be omitted. It is also possible to omit the output optical path 16 so that the TWA 50 is placed in intimate contact with the photodetector 92.

In the third embodiment described above, drive pulses that are shifted successively on a time axis are formed by using the optical signal to be measured, and the optical signal is sampled successively by means of said drive pulses. As a result, the optical signal being measured is reconstructed to produce a waveform on the display unit 104 as shown in FIG. 16.

Figure 17:
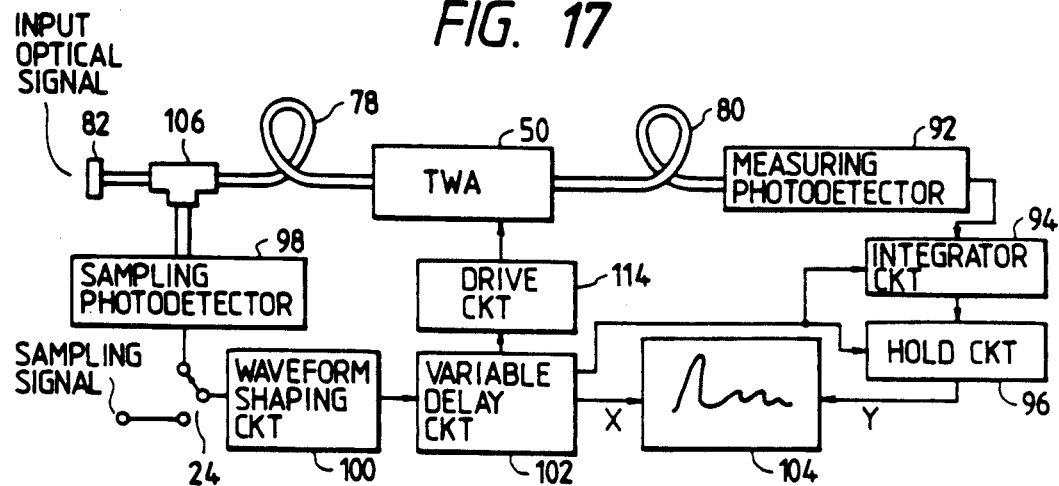
FIG. 17 is a block diagram showing the composition of an optical signal sampling apparatus according to a fourth embodiment of the present invention as it is applied to a sampling type light waveform measuring system.

A fourth embodiment of the present invention is now described in greater detail with reference to FIG. 17. This embodiment is essentially the same as the sampling type light waveform measuring system according to the third embodiment, except that optical fibers 78 and 80 are used as the input and output optical paths 12 and 16, respectively, and that a fiber beam splitter 106 is used in place of the beam splitter 90. In addition, a mode selecting switch 24 is provided between the sampling photodetector 98 and the waveform shaping circuit 100 so as to enable the mode selection between automatic synchronization sampling by the optical signal itself and sampling by an external electrical signal.

The optical fiber 78 is so designed that propagation of light is delayed to compensate for the delay in the propagation of the drive signal through the light input section, light waveform shaping circuit 100, etc. so as to ensure that the timing of arrival of the optical signal at the TWA 50 will coincide with the drive signal.

As with the third embodiment, the optical fiber 80 may be omitted so that the measuring photodetector 92 is placed in intimate contact with the TWA 50.

Figure 18:
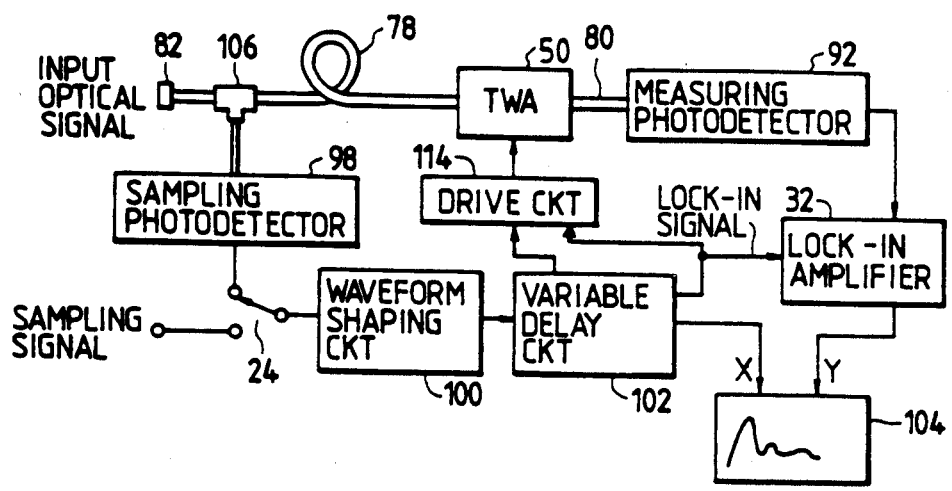
FIG. 18 is a block diagram showing the composition of an optical signal sampling apparatus according to a fifth embodiment of the present invention as it is applied to a sampling type light waveform measuring system.
Figure 20:
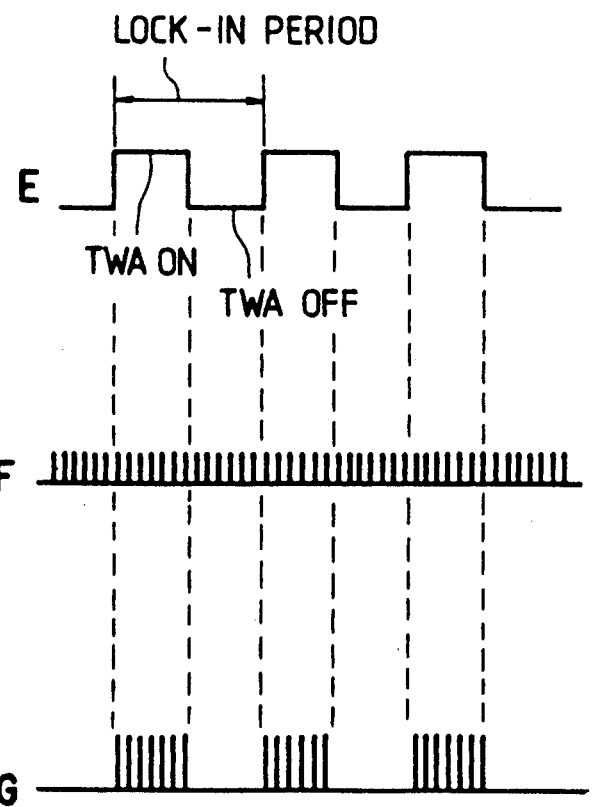
FIG. 20 is a diagram showing the operating waveforms for the essential parts of the apparatus according to the sixth embodiment.

A fifth embodiment of the present invention is described below in greater detail with reference to FIG. 18. This embodiment is essentially the same as the sampling type light waveform measuring system according to the fourth embodiment, except that it includes a lock-in amplifier 32 which performs lock-in amplification of the output from the measuring photodetector 92 by using a lock-in signal which is the output of the variable delay circuit 102. The TWA 50 is driven by an electrical signal that is modulated with a lock in signal having the waveform as shown in FIG. 20 (see below).

In this fifth embodiment, the lock-in signal is determined on the basis of the sampling signal so as to perform self-locking-in. The optical fiber 80 may be omitted from the system shown in FIG. 18.

Figure 19:
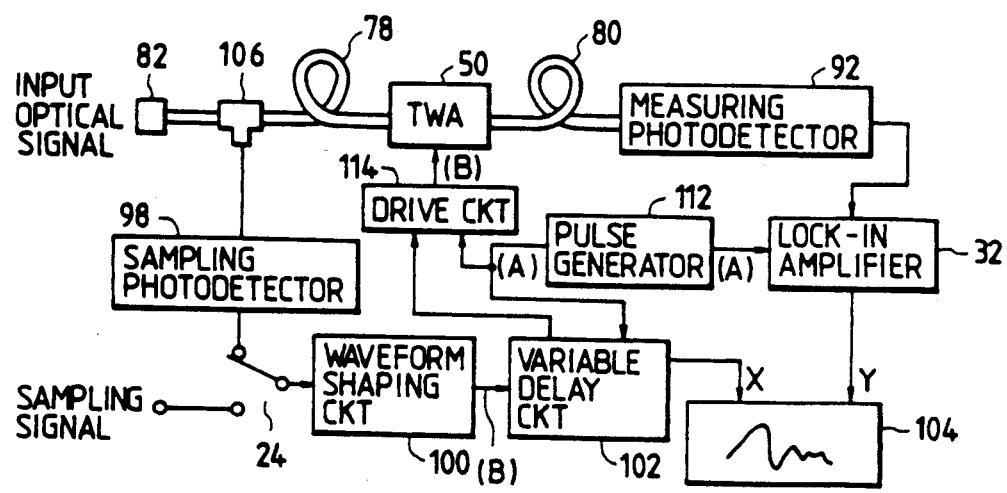
FIG. 19 is a block diagram showing the composition of an optical signal sampling apparatus according to a sixth embodiment of the present invention as it is a applied to a sampling type light waveform measuring system.

A sixth embodiment of the present invention is now described in greater detail with reference to FIG. 19. This embodiment is essentially the same as the sampling type light waveform measuring system according to the fifth embodiment, except that it includes a pulse generator 112 that generates a lock-in signal for controlling the drive signal applied to the TWA 50 and lock-in amplifier 32. The pulse generator 112 generates the lock-in signal E which, as shown in FIG. 20(A), is used to turn on and off the drive signal to the TWA 50, and is also used to perform lock-in amplification in the lock-in amplifier 32, so the lock-in amplification can be performed at a frequency that is independent of the frequency of the output electrical signal F from the waveform shaping circuit 100 which is shown in FIG. 20(B). In this case, the delay time determined by the variable delay circuit 102 changes in synchronism with the lock-in signal F. FIG. 20(C) shows TWA drive signal G.

The systems of the fifth and sixth embodiment feature a simple configuration since a chopper element for detecting a locking-in mode is also used by the TWA 50. In a modified embodiment, an independent TWA for detecting a locking-in mode may be connected in series with the TWA 50. It is also possible to omit the optical fiber 80.

A seventh embodiment of the present invention is described below with reference to FIG. 21. In this embodiment, a plurality of units of the optical signal sampling apparatus according to the second embodiment are arranged side by side and an image sensor 120 for detecting the output optical signal from each unit is provided so as to enable a plurality of optical signals of interest to be measured simultaneously and in a parallel way. The system shown in FIG. 21 includes a sampling photodetector 98 for generating a sampling signal in response to an optical signal to be measured, a mode selecting switch 24 for performing the mode selection between external synchronization sampling and self-synchronization sampling, a variable delay circuit 102, a controller 122, and a display unit 124. The image sensor 120 may be a linear sensor using CCD or some other suitable device.

Figure 21:
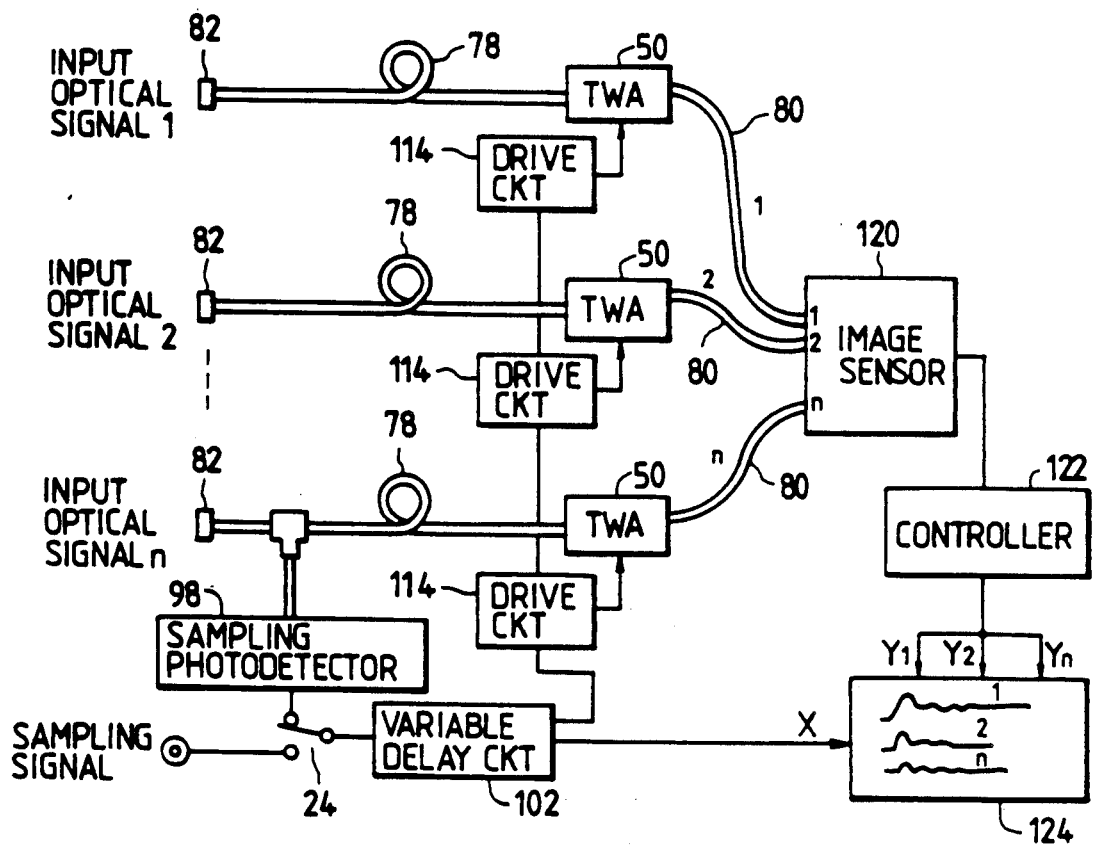
FIG. 21 is a block diagram showing the composition of a seventh embodiment of the present invention which is adapted for simultaneous parallel measurements of a plurality of optical signals of interest.

The embodiment shown in FIG. 21 enables a plurality of optical signals of interest to be measured simultaneously and in a parallel mode, so using this, an offset in the timing of individual input signals can be measured. A further advantage of this system is that a spectral measurement can be performed by dividing input light into respective components of wavelength with a spectroscope and then launching them into the associated optical fibers 78.

What is claimed is:

1. An optical signal sampling apparatus for highspeed sampling of an optical signal having the form of repetitive waveforms, comprising:

an input optical path for introducing said optical signal to an optical amplifier;

said optical amplifier whose gain is adjustable by a gating electrical signal, for amplifying said optical signal;

driving circuit means for providing, in response to a sampling signal, said optical amplifier with said gating electrical signal having a series of pulses which are successively shifted in phase by gradually increasing amounts with respect to said repetitive waveforms of said optical signal, whereby different portions of said repetitive waveforms are sampled; and an output optical path for introducing an output optical signal from said optical amplifier.

2. An optical signal sampling apparatus according to claim 1, wherein said optical amplifier is a non-resonant traveling-wave type optical amplifier comprising a semiconductor laser having two end faces and an anti-reflection film which is coated on each end face of said semiconductor laser.

3. An optical signal sampling apparatus according to claim 1, wherein said optical amplifier is a non-resonant traveling wave type optical amplifier comprising a semiconductor laser having two end faces each of which is preadjusted to have the Brewster angle.

4. An optical signal sampling apparatus according to claim 1, wherein said input optical path comprises an optical fiber whose length is preadjusted so that said optical signal and said gating electrical signal are supplied to said optical amplifier at a desired time of arrival.

5. An optical signal sampling apparatus according to one of claims 1 to 4, wherein said input optical path, said optical amplifier, said driving circuit means and said output optical path are enclosed within a lightshielding electroconductive casing.

6. An optical signal sampling apparatus according to claim 1, further comprising beam splitting means for branching part of said optical signal, and a photodetector for converting said part of said optical signal into said sampling signal.

7. An optical signal sampling apparatus according to claim 1, further comprising a second photodetector for detecting said output optical signal from said optical amplifier, and a lock-in amplifier for performing lock-in amplification of an output signal from said photodetector in accordance with a lock-in signal which is in synchronism with said sampling signal, wherein said gating electrical signal is modulated by said lock-in signal.

8. An optical signal sampling apparatus according to claim 1, further comprising a photodetector for detecting said output optical signal from said optical amplifier, a lock-in amplifier for performing lock-in amplification of an output from said photodetector in accordance with a lock-in signal, and a pulse generator for receiving said gating electrical signal from said driving circuit means and providing said lock-in amplifier with said lock-in signal whose frequency and phase are independent of said sampling signal.

9. An optical signal sampling apparatus according to claim 1, wherein a plurality of said optical signal sampling apparatuses are connected in parallel, further comprising an image sensor for detecting a plurality of said output optical signals from said optical amplifiers substantially at the same time.

* * * * *

UNITED STATES PATENT AND TRADEMARK OFFICE
CERTIFICATE OF CORRECTION

PATENT NO. : 5,003,268
DATED : March 26, 1991
INVENTOR(S) : Yutaka Tsuchiya It is certified that error appears in the above-identified patent and that said Letters Patent is hereby corrected as shown below:

Claim 1, Column 9, Line 61, change "highspeed" to --high-speed--;

Claim 3, Column 10, Line 22, change "traveling wave" to --traveling-wave--;

Claim 5, Column 10, Line 34, change "lightshielding" to --light-shielding--; and Claim 8, Column 10, Line 53, after "output" insert --signal--.

Signed and Sealed this

Twenty-ninth Day of December, 1992

*Attest:*

DOUGLAS B. COMER

*Attesting Officer*     *Acting Commissioner of Patents and Trademarks*